United States Patent
Das et al.

(10) Patent No.: US 9,648,414 B1
(45) Date of Patent: May 9, 2017

(54) SYSTEMS AND METHODS FOR CONTROLLING AN AUDIO SIGNAL PATH USING REDUNDANT UNINTERRUPTABLE CLOCK

(71) Applicant: Cirrus Logic, Inc., Austin, TX (US)

(72) Inventors: Tejasvi Das, Austin, TX (US); Daniel John Allen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 233 days.

(21) Appl. No.: 14/169,946

(22) Filed: Jan. 31, 2014

(51) Int. Cl.
| | | |
|---|---|---|
| H04R 3/00 | (2006.01) | |
| H03G 3/00 | (2006.01) | |
| G06F 1/00 | (2006.01) | |
| H04M 3/00 | (2006.01) | |
| H04R 1/40 | (2006.01) | |
| H03K 3/00 | (2006.01) | |
| G11B 20/14 | (2006.01) | |
| G06F 13/42 | (2006.01) | |
| G11B 20/10 | (2006.01) | |

(52) U.S. Cl.
CPC .............. H04R 3/00 (2013.01); H03G 3/00 (2013.01); G06F 1/00 (2013.01); G06F 13/42 (2013.01); G11B 20/10527 (2013.01); G11B 20/1403 (2013.01); H03K 3/00 (2013.01); H04M 3/002 (2013.01); H04R 1/403 (2013.01); H04R 1/406 (2013.01)

(58) Field of Classification Search
CPC ......... H03K 3/00; H04M 3/002; H04R 1/403; H04R 1/406; G06F 1/00; G06F 13/42; G06F 17/00; G11B 20/10527; G11B 20/1403; G11B 2220/2562

USPC ..... 381/74, 97–98; 700/94; 330/207 A, 251; 327/171–176, 31, 33, 35, 94, 291, 298
See application file for complete search history.

(56) References Cited

U.S. PATENT DOCUMENTS

| | | | | |
|---|---|---|---|---|
| 4,849,993 A | * | 7/1989 | Johnson ................. | H03L 7/143 331/1 A |
| 5,138,634 A | * | 8/1992 | Knapp ................. | H04J 3/0614 340/12.2 |
| 6,216,052 B1 | * | 4/2001 | Gulick ................. | H03F 1/0211 381/94.5 |
| 6,282,611 B1 | * | 8/2001 | Hamamoto et al. .......... | 711/115 |
| 6,901,462 B2 | * | 5/2005 | Minoshima et al. ........... | 710/29 |
| 6,970,045 B1 | * | 11/2005 | Lichter .................... | H03L 7/08 331/2 |
| 8,446,193 B2 | * | 5/2013 | Zhang .................... | H03L 7/146 327/147 |

(Continued)

*Primary Examiner* — Davetta W Goins
*Assistant Examiner* — Kuassi Ganmavo
(74) *Attorney, Agent, or Firm* — Jackson Walker L.L.P.

(57) ABSTRACT

Responsive to the absence of a reference clock input signal to a clock conditioning circuit for generating a desired clock signal for synchronizing components of an audio signal path, a controller may cause the signal path to receive at the clock input a substitute clock signal in the absence of the reference clock input signal and may modify one or more parameters of the signal path in order to perform one or more of the following: (i) reduce the presence of audio artifacts in the output signal caused by the absence of the reference clock input signal; (ii) power down at least one component of the signal path to reduce power consumed by the signal path; (iii) continue to operate the signal path with the substitute clock signal; and (iv) transition the signal path to a mute condition or a zero volume condition.

33 Claims, 4 Drawing Sheets

(56) References Cited

U.S. PATENT DOCUMENTS

| | | |
|---|---|---|
| 2002/0033734 A1* | 3/2002 | Broadley ................... 330/251 |
| 2002/0142724 A1* | 10/2002 | Nakano ..................... 455/62 |
| 2004/0064751 A1* | 4/2004 | Anglada ................... 713/500 |
| 2004/0131093 A1* | 7/2004 | Waarts et al. ............. 372/22 |
| 2004/0145982 A1* | 7/2004 | Tsai ................. G11B 27/24 |
| | | 369/47.28 |
| 2005/0080500 A1* | 4/2005 | Kimura ..................... 700/94 |
| 2010/0077247 A1* | 3/2010 | McHarg et al. ............ 713/400 |
| 2010/0249964 A1* | 9/2010 | Makino et al. ............. 700/94 |
| 2012/0013406 A1* | 1/2012 | Zhu et al. ................ 331/34 |
| 2015/0110295 A1* | 4/2015 | Jenkner ................. H04R 1/08 |
| | | 381/114 |

* cited by examiner

SYSTEMS AND METHODS FOR CONTROLLING AN AUDIO SIGNAL PATH USING REDUNDANT UNINTERRUPTABLE CLOCK

FIELD OF DISCLOSURE

The present disclosure relates in general to circuits for audio devices, including without limitation personal audio devices such as wireless telephones and media players, and more specifically, to systems and methods for controlling an audio signal path having components which receive a clock signal from a redundant uninterruptable clock conditioning circuit.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

Personal audio devices may employ integrated circuits that may include many components, and each of the components may operate from and/or be synchronized with a clock signal. When the clock signal becomes unavailable, the components may fail to operate and/or fall out of synchronization. The integrated circuits then begin producing erroneous output and eventually cease operating. For example, when the output of one component is communicated to the input of another component, the two components may be synchronized such that the second component knows when the first component has output data intended for reading by the second component.

A phase-locked loop (PLL) is one component that operates from a clock signal. The PLL may receive an input clock signal and generate a clock signal that may be used to operate and/or synchronize other components. In particular, a PLL generates an output clock with a phase and/or frequency that has a determined relationship to an input clock's phase and frequency, such as the master clock's phase and frequency. The output clock signal from the PLL may be used to operate, for example, audio components such as an audio amplifier.

A PLL may be further enhanced with a redundant uninterruptable clock conditioning circuit. Such a clock conditioning circuit may be configured to, in the absence of a master clock to the PLL, generate a substitute clock signal such that the clock signal is uninterrupted in the absence of the master clock, thus allowing redundant operation of the PLL even when no reference clock input signal is present.

SUMMARY

In accordance with the teachings of the present disclosure, one or more disadvantages and problems associated with existing approaches to maintaining a high dynamic range of an audio signal path may be reduced or eliminated.

In accordance with embodiments of the present disclosure, an apparatus for providing an audio output signal to an audio transducer may include a signal path and a controller. The signal path may have an audio input for receiving an audio input signal, an audio output for providing the audio output signal, and a clock input for receiving a clock signal, wherein the signal path is configured to generate the audio output signal based on the input signal and in conformity with one or more parameters of the signal path. The controller may be configured to determine a presence or an absence of a reference clock input signal to a clock conditioning circuit for generating the clock signal, wherein the clock conditioning circuit generates a desired clock signal as the clock signal that is based on the reference clock input signal in the presence of the reference clock input signal and generates a substitute clock signal as the clock signal in the absence of the reference clock input signal such that the clock signal is uninterrupted in the absence of the reference clock input signal, and wherein the input reference signal is representative of a desired clock frequency for the clock signal. Responsive to determining the absence of the reference clock input signal, the controller may be configured to cause the signal path to receive at the clock input the substitute clock signal in the absence of the reference clock input signal and may modify the one or more parameters of the signal path in order to perform one or more of the following: (i) reduce the presence of audio artifacts in the output signal caused by the absence of the reference clock input signal; (ii) power down at least one component of the signal path; (iii) continue to operate the signal path with the substitute clock signal; and (iv) transition the signal path to a mute condition or a zero volume condition.

In accordance with these and other embodiments of the present disclosure, a method may include determining a presence or an absence of a reference clock input signal to a clock conditioning circuit for generating a clock signal, wherein the clock conditioning circuit generates a desired clock signal as the clock signal that is based on the reference clock input signal in the presence of the reference clock input signal and generates a substitute clock signal as the clock signal in the absence of the reference clock input signal such that the clock signal is uninterrupted in the absence of the reference clock input signal, and wherein the input reference signal is representative of a desired clock frequency for the clock signal. The method may also include, responsive to determining the absence of the reference clock input signal: (a) causing a signal path to receive at a clock input the substitute clock signal in the absence of the reference clock input signal, wherein the signal path comprises an audio input for receiving an audio input signal, an audio output for providing an audio output signal, and the clock input for receiving the clock signal; and (b) modifying one or more parameters of the signal path in order to perform one or more of the following: (i) reducing the presence of audio artifacts in the output signal caused by the absence of the reference clock input signal; (ii) powering down at least one component of the signal path; (iii) continuing to operate the signal path with the substitute clock signal; and (iv) transitioning the signal path to a mute condition or a zero volume condition; further wherein the signal path is configured to generate the audio output signal based on the input signal and in conformity with one or more parameters of the signal path.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
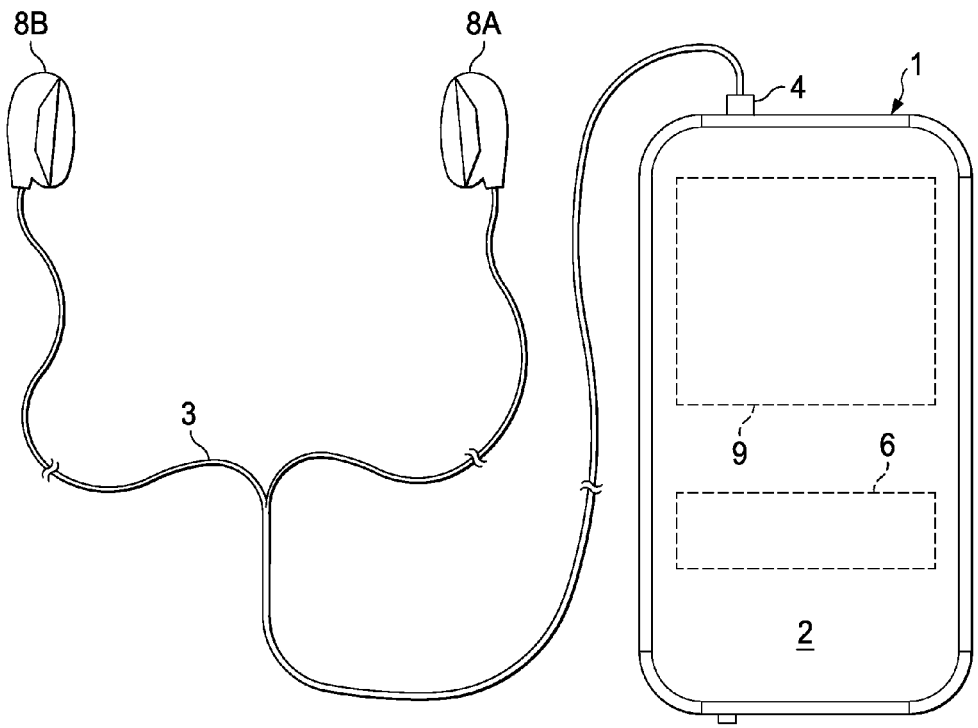
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer. In addition, personal audio device 1 may include digital circuitry 6. Digital circuitry 6 may include any suitable number and type of digital components, including for example one or more processors, controllers, memories, etc.

Figure 2:
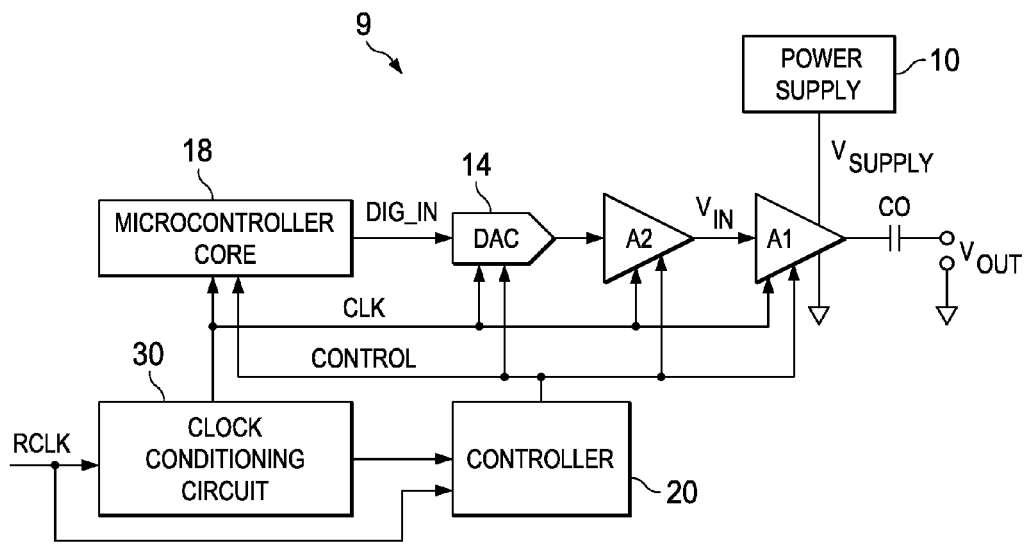
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may in turn supply an analog audio input signal $V_{IN}$ to a power amplifier stage A1 which may amplify or attenuate the audio input signal $V_{IN}$ and provide an audio output signal $V_{OUT}$, which may operate a speaker, headphone transducer, and/or a line level signal output. A capacitor CO may be utilized to couple the output signal to the transducer or line level output, particularly if amplifier A1 is operated from a unipolar power supply having a quiescent voltage substantially differing from ground. A power supply 10 may provide the power supply rail inputs of amplifier A1. In some embodiments, power supply 10 may comprise a charge pump power supply.

As shown in FIG. 2, components of audio IC 9 and events occurring within the signal path (e.g., components making up the path from DIG_IN to $V_{OUT}$) may be synchronized by a clock signal CLK generated by a clock conditioning circuit 30. Clock conditioning circuit 30 may receive a reference clock input signal RCLK representative of a desired clock frequency for clock signal CLK. Clock conditioning circuit 30 may be configured to generate a desired clock signal with the desired clock frequency as the clock signal CLK based on reference clock input signal RCLK in the presence of reference clock input signal RCLK and generate a substitute clock signal as clock signal CLK in the absence of reference clock input signal RCLK such that the clock signal CLK is uninterrupted in the absence of reference clock input signal RCLK. In some embodiments, a clock conditioning circuit 30 may comprise a circuit similar to that described in U.S. patent application Ser. No. 14/016,972 entitled "Dual-Input Oscillator for Redundant Phase-Locked Loop (PLL) Operation," which is incorporated herein by reference. An example clock conditioning circuit 30 is described in greater detail below.

In addition, audio IC 9 may include a controller 20. Controller 20 may be configured to determine a presence or an absence of reference clock input signal RCLK to clock conditioning circuit 30. Responsive to determining the absence of reference clock input signal RCLK, components of the signal path of audio IC 9 may receive the substitute clock signal as clock signal CLK and controller 20 may modify one or more parameters of the signal path in order to reduce the presence of audio artifacts in output signal $V_{OUT}$ caused by the unexpected absence of reference clock input signal RCLK, as described in greater detail below.

Figure 3:
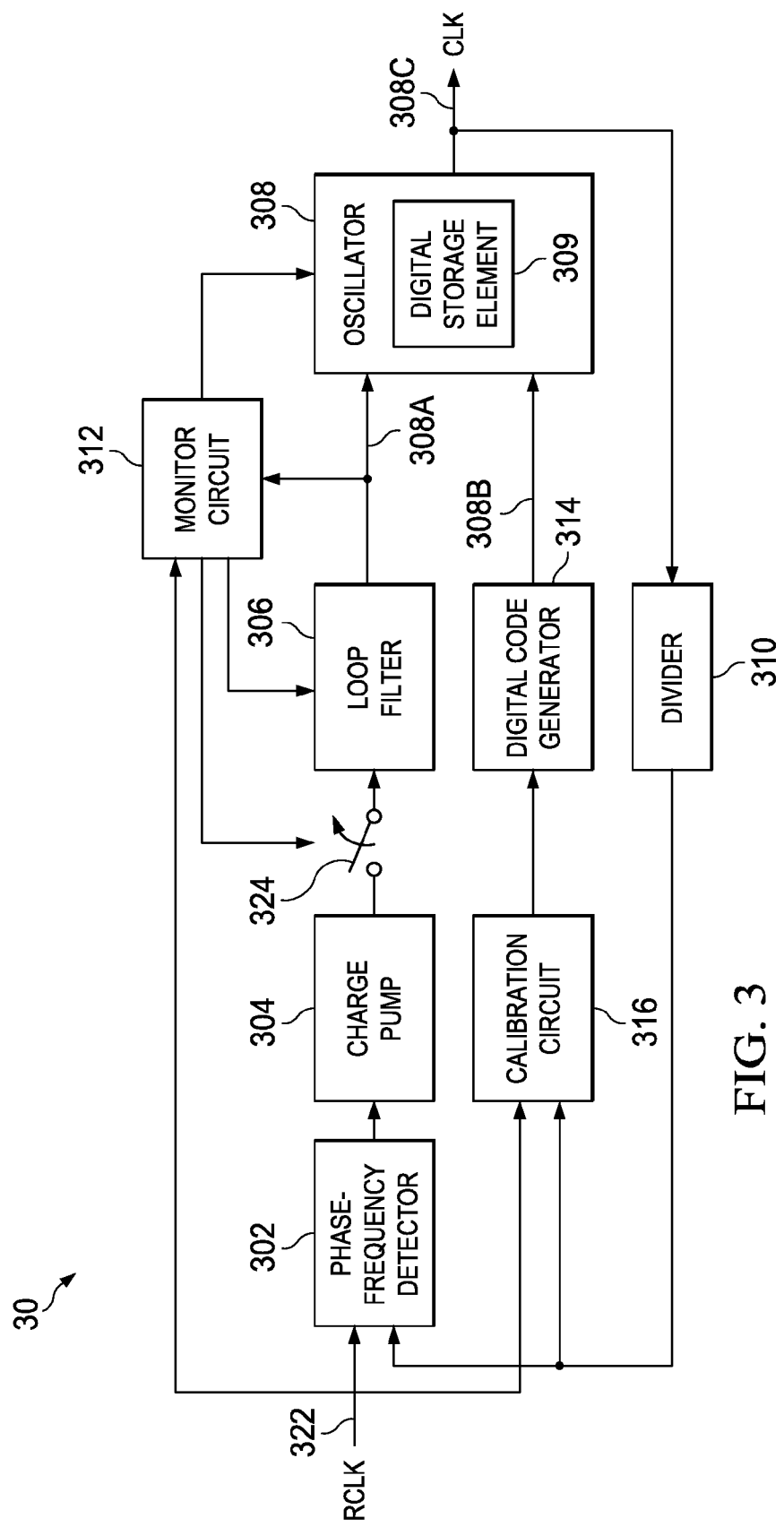
FIG. 3 is a block diagram of select components of a clock conditioning circuit including a PLL with an oscillator having two inputs, in accordance with embodiments of the present disclosure.

FIG. 3 is a block diagram of select components of a clock conditioning circuit 30 including a PLL with an oscillator 308 having two inputs, in accordance with embodiments of the present disclosure. Clock conditioning circuit 30 may include an oscillator 308 having a first input node 308A and a second input node 308B. First input node 308A may receive an input from a path including a loop filter 306, a charge pump 304, and a phase-frequency detector (PFD) 302, which receive a reference clock input signal RCLK at an input node 322. Input node 322 may receive reference clock input signal RCLK from a component external to clock conditioning circuit 30 or external to audio IC 9. The input signal to the input node 308A may be an analog input representative of a desired clock frequency for an output clock signal from the oscillator 308. The analog input at the input node 308A may be generated by PH) 302, charge pump 304, and loop filter 306 based on reference clock input signal RCLK received at input node 322. A divider 310 may be coupled between oscillator 308 and PH) 302 to close a feedback loop in the PLL making up clock conditioning circuit 30. Divider 310 may be configured to receive an input signal of a first frequency, and generate an output signal of a second frequency, wherein the ratio between the first frequency and the second frequency is an integer. Based on the value of such ratio, a frequency for clock signal CLK generated by clock conditioning circuit 30 may be set.

Second input node 308B may receive an input from a digital code generator 314. Oscillator 308 may include a digital storage element 309 (e.g., a memory or a register), to store at least one digital code from digital code generator 314. Digital code generator 314 may generate a digital signal for input to oscillator 308 through second input node 308B. The digital signal may be a multi-bit n-length signal, such as a 4-bit code, for example. Each code generated by digital code generator 314 may produce a different frequency output clock signal from oscillator 308. A calibration circuit 316 may be coupled to digital code generator 314. At certain times, calibration circuit 316 may instruct digital code generator 314 to output certain codes such that calibration circuit 316 may measure the output frequency from oscillator 308 to correlate each code to a certain frequency or frequency range output by oscillator 308. Calibration circuit 316 may, for example, execute at start-up of clock conditioning circuit 30 and shut down after start-up to reduce power consumption by clock conditioning circuit 30.

Oscillator 308 may generate an output clock signal CLK at an output node 308C based on input at first input node 308A and second input node 308B. For example, a digital code received from second input node 308B may set an approximate frequency for output from the oscillator 308. In one embodiment, the digital code may set oscillator 308 to a desired clock frequency. In another embodiment, the input of a digital code at the second input node 308B may coarsely determine an output frequency with a margin of error corresponding to a frequency range. Input to oscillator 308 may receive an analog input through first input node 308A to fine-tune an output frequency of oscillator 308.

A clock monitor circuit 312 may be coupled to first input node 308A to determine when an input to the oscillator 308 through first input node 308A disappears, which correlates with a disappearance of reference clock input signal RCLK at input node 322. Clock monitor circuit 312 may be coupled to loop filter 306, oscillator 308, and/or other components within clock conditioning circuit 30 to configure the components based on the disappearance of reference clock input signal RCLK. When reference clock input signal RCLK at input node 322 disappears, the input signal at first input node 308A may also disappear. Monitor circuit 312 may detect this condition and configure oscillator 308 to output a clock signal based on second input signal 308B. Clock monitor circuit 312 may also or alternatively be coupled to input node 322 (not shown) to determine the presence of a reference clock input signal and configure components in clock conditioning circuit 30 appropriately. In one embodiment, clock monitor circuit 312 may determine reference clock input signal RCLK has disappeared when the frequency of reference clock input signal RCLK exceeds a range defined by a high-frequency threshold and a low-frequency threshold.

In accordance with some embodiments, clock monitor circuit 312 may implement an analog or a digital monitoring circuit. For example, a digital monitoring circuit may count a number of transitions at the output of oscillator 308 between transitions at input node 322. When reference clock input signal RCLK is present, oscillator 308 should produce a certain number of transitions at output node 308C based on the desired frequency for oscillator 308. When the number of transitions at output node 308C exceeds or is below the expected number of transitions between transitions of reference clock input signal RCLK, reference clock input signal RCLK may be determined to have disappeared. The number of transitions at output node 308C may change because the feedback loop through the PLL of clock conditioning circuit 30 may degrade after the reference clock input signal RCLK is lost. In another example, an analog monitoring circuit may monitor the input voltage at first input 308A of oscillator 308. When the first input exceeds a high threshold or falls below a low threshold, reference clock input signal RCLK may be determined to have disappeared.

Two input nodes 308A and 308B to oscillator 308 may allow oscillator 308 to continue generating an output clock signal even when reference clock input signal RCLK disappears, and there is a time delay in the disappearance being recognized. Although a disappearance of reference clock input signal RCLK may cause the first input at first input node 308A to push the clock frequency of output clock signal CLK to zero, the second input at second input node 308B may hold the output clock frequency. In some embodiments, the second input may hold the output clock frequency at the desired output frequency. In other embodiments, the second input may set only an approximate output clock frequency.

Clock monitor circuit 312 may also be coupled to loop filter 306 and configure loop filter 306 based on the presence of an input signal at first input node 308A. For example, when reference clock input signal RCLK is determined to disappear and oscillator 308 shifts to generating an output clock signal based on the second input, loop filter 306 may be programmed for a lower bandwidth and a higher phase margin. When reference clock input signal RCLK returns, loop filter 306 may be programmed to the original bandwidth and phase margin settings. Adjusting the bandwidth and phase margin of loop filter 306 may create a smoother transition between operating modes of oscillator 308 when reference clock input signal RCLK disappears and may reduce or eliminate overshoots or ripples in the frequency of output clock signal CLK.

A switch 324 may be coupled between oscillator 308 and charge pump 304. Switch 324 may be controlled by clock monitor circuit 312 to open when reference clock input signal RCLK disappears. Thus, the feedback loop of the PLL of clock conditioning circuit 30 is opened and the input signal at first input node 308A may be disconnected from oscillator 308. When reference clock input signal RCLK re-appears, clock monitor circuit 312 may close switch 324 to reconnect input to first input node 308A of the oscillator 308. Alternatively or additionally to switch 324, switches (not shown) within charge pump 304 may be opened to disconnect the input signal from first input node 308A of oscillator 308. In this configuration, clock monitor circuit 312 may also be coupled to the charge pump 304 to open and close switches within charge pump 304 based on a presence of reference clock input signal RCLK. Thus, the PLL of clock conditioning circuit 30 may be, responsive to the absence of reference clock input signal RCLK, configured to transition from a closed-loop mode to an open-loop mode such that an oscillator of the phase-locked loop for generating the clock signal continues to generate the clock signal without interruption.

Figure 4:
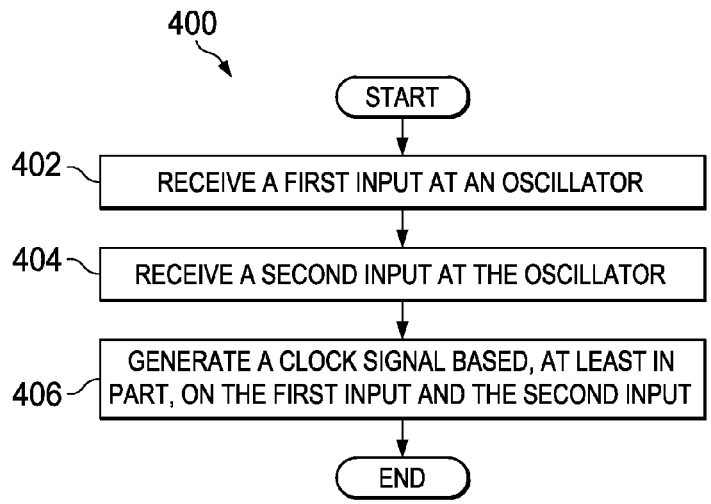
FIG. 4 is a flow chart of a method of generating a clock signal output based on two inputs, in accordance with embodiments of the present disclosure.

FIG. 4 is a flow chart of a method 400 of generating an output clock signal (e.g., CLK) based on two inputs (e.g. at first input node 308A and second input node 308B), in accordance with embodiments of the present disclosure. Method 400 may begin at step 402 with receiving a first input at an oscillator (e.g., oscillator 308), continue to step 404 with receiving a second input at the oscillator, and at step 406, generating a clock signal (e.g., CLK) based, at least in part, on the first input and the second input. The first input received at step 402 may be, for example, an analog signal representative of a desired clock frequency for the output clock signal. The second input received at step 404 may be, for example, a digital signal representative of a calibrated output frequency range for the oscillator. The clock signal generated at step 406 may be generated by coarsely selecting a frequency range with the second input of step 404 and fine-tuning the selected frequency with the first input of step 402.

Figure 5:
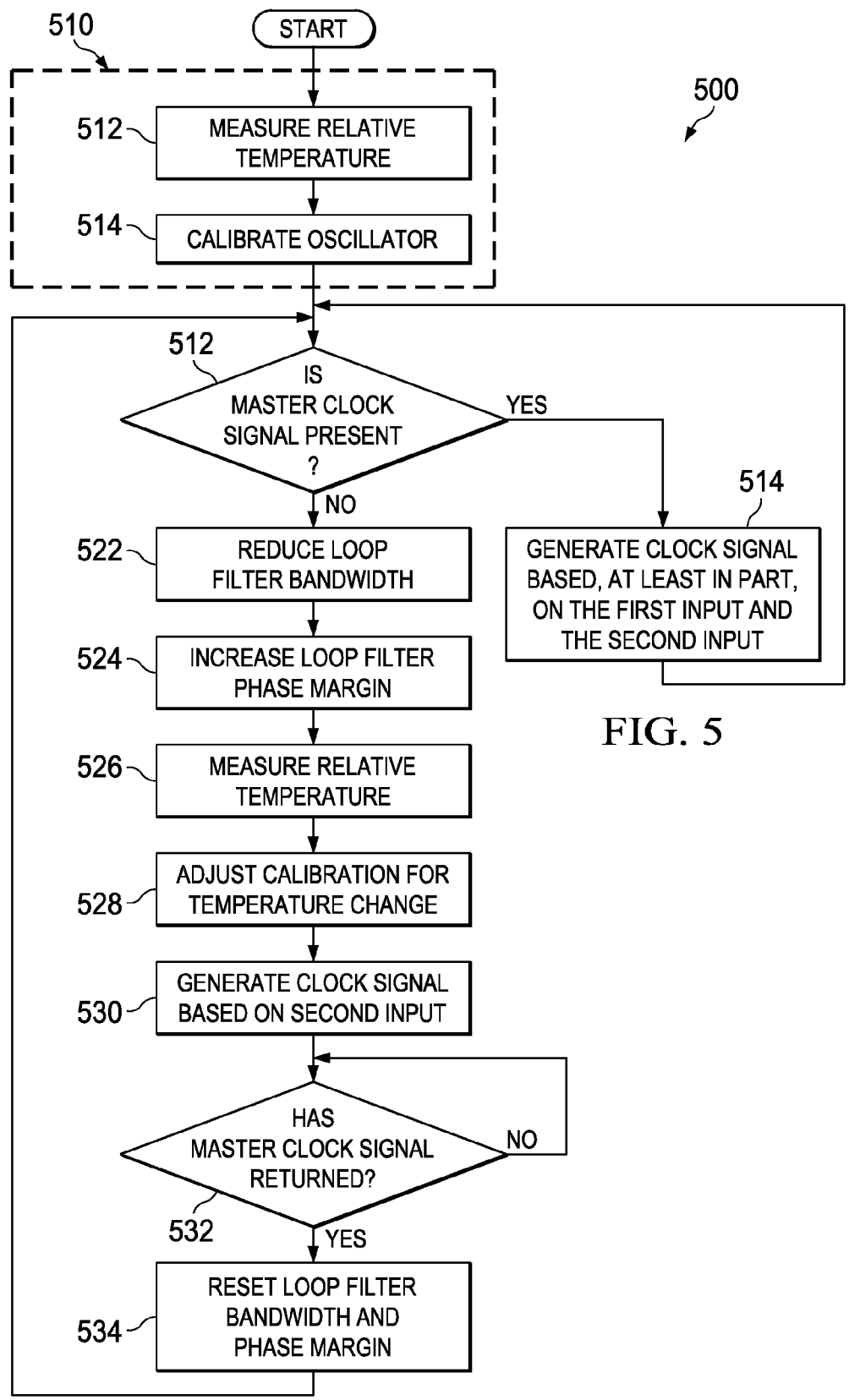
FIG. 5 is a flow chart illustrating a method of operating the clock conditioning circuit depicted in FIG. 3, in accordance with embodiments of the present disclosure.

Components of a clock conditioning circuit, such as clock conditioning circuit 30 of FIG. 3, may be coordinated by a clock monitoring circuit (e.g., clock monitor circuit 312). FIG. 5 is a flow chart illustrating a method 500 of operating a clock conditioning circuit (e.g., clock conditioning circuit 30 depicted in FIG. 3), in accordance with embodiments of the present disclosure. Method 500 may be executed, in part, by a clock monitoring circuit (e.g., clock monitor circuit 312) or by other logic circuits coupled to the clock monitoring circuit. Method 500 may begin with a start-up phase 510 including measuring a relative temperature at step 512 and calibrating an oscillator (e.g., oscillator 308) at step 514. Calibration at step 514 may include mapping output frequencies of the oscillator to digital input codes provided (e.g., by digital code generator 314) to the oscillator. For example, a digital input code of 0x01 may correspond to an output frequency of 1.58 megahertz (MHz), and a digital input code of 0x0F may correspond to an output frequency of 13.13 megahertz (MHz). The calibrated digital input codes may be stored, for example, in a memory device (e.g, digital storage element 309), such as random access memory ("RAM") or read only memory ("ROM"), or stored in processor registers. The calibration at step 514 may correspond to the relative measured temperature at step 512, and the calibration may be adjusted based on relative temperature changes measured at a later time. According to one embodiment, calibration at step 514 may include performing a digital search through digital code to find a particular desired frequency for operation of the clock conditioning circuit.

At step 512, method 500 may determine whether a reference clock input signal (e.g., CLK) is present. If the reference clock input signal is present, then method 500 may continue to step 514 to generate the desired clock signal as the clock signal based, at least in part, on the first input and the second input. Method 500 may continue looping through step 512 and step 514 until the reference clock input signal is determined to not be present. When the reference clock input signal is not present at step 512, method 500 may continue to step 522.

Starting at step 522, the clock conditioning circuit may prepare for and operate the oscillator based on the second input to allow the oscillator to continue to produce a substitute clock signal as the output clock signal even though the reference clock input signal has disappeared. At step 522, the bandwidth of a loop filter (e.g., loop filter 306) of the clock conditioning circuit may be reduced and, at step 524, the phase margin of the loop filter may be increased. The adjustments made in steps 522 and 524 may ensure that, when the clock conditioning circuit returns to operation based on the first input, any glitches, overshoots, or other artifacts in the output frequency of the clock conditioning circuit are minimized. At step 526, a relative temperature may be measured, and, at step 528, the calibration of step 514 may be adjusted for the measured relative temperature of step 526.

At step 530, the output clock signal may be generated based on the second input. According to some embodiments, when the reference clock input signal disappears, the first input of the oscillator may be connected to a predetermined voltage input and the clock signal may then be generated based on the second input and the fixed voltage at the first input. The predetermined voltage may be, for example, a point between a high voltage supply and a low voltage supply.

In these and other embodiments, after the oscillator changes modes to generate an output clock signal when the reference clock input signal disappears, a control circuit (e.g., controller 20) may begin to shut down sub-systems (e.g., portions of the signal path of audio IC 9) dependent on the clock signal CLK, or otherwise modify one or more operating parameters of such sub-systems. For example, if the reference clock input signal input disappearance is related to a larger system-wide failure, the control circuit may begin to shut down or or modify operating parameters of such components, including analog and/or digital components within an integrated circuit (e.g., microcontroller core 18, DAC 14, amplifier A2, and/or amplifier A1). Such shut down and/or modification of operating parameters may prevent abnormal behavior, such as an audio amplifier outputting audible noise and/or undesirable audio artifacts (e.g., "pops" or "clicks"). Responsive to the absence of the reference clock input signal, the controller may generate an interrupt signal or other control signal that can be transmitted to other electronic components to alert the other electronic components to also enter the safe shut-down mode or modify one or more operating parameters.

In some embodiments, modifying the one or more operating parameters may comprise modifying an analog gain of an analog signal portion (e.g., amplifiers A1 and A2) of a signal path. For example, modifying the one or more parameters may comprise ramping the analog gain to zero in response to disappearance of the reference clock input signal. Ramping the analog gain to zero may be preferable to instantaneously setting the analog gain to zero in order to avoid audio artifacts.

In these and other embodiments, modifying the one or more parameters may cause powering down of one or more components (e.g., DAC 14, amplifiers A1, A2) of the signal path in order to reduce power consumed by the signal path while the reference clock input signal is absent.

In these and other embodiments, the one or more parameters comprise a digital gain of digital-to-analog conversion portion of a signal path (e.g., DAC 14). For example, modifying the one or more parameters may comprise ramping the digital gain to zero. Ramping the digital gain to zero may be preferable to instantaneously setting the digital gain to zero in order to avoid audio artifacts.

In these and other embodiments, modifying the one or more parameters may include modifying the audio input signal (e.g., DIG_IN). In such embodiments, modifying the audio input signal may comprise ramping the audio input signal to zero. Ramping the audio input signal to zero may be preferable to instantaneously setting the audio input signal to zero in order to avoid audio artifacts. Alternatively or additionally, in such embodiments, modifying the one or more parameters may further comprise clamping the audio output signal (e.g., $V_{OUT}$) to a predetermined direct current voltage.

In these and other embodiments, modifying the one or more parameters may cause the signal path to enter a mode wherein the signal path continues to operate uninterrupted with reduced audio performance of the audio output signal.

In these and other embodiments, the controller may be further configured to, responsive to determining the presence of the reference clock input signal following the absence of the reference clock input signal, reinstate the one or more parameters to their respective unmodified settings in place prior to the disappearance of the reference clock input signal.

In these and other embodiments, components of the clock conditioning circuit, such as the charge-pump (e.g., charge pump 304), the PFD (e.g., PFD 302), and the divider (e.g., divider 310), may be shut down to conserve power.

In these and other embodiments, as illustrated in FIG. 5, the clock conditioning circuit may continue to operate without the reference clock input signal to allow recovery when the reference clock input signal returns. At step 532, the clock conditioning circuit may determine if the reference clock input signal has returned. If the reference clock input signal has not returned, method 500 may loop at step 532, generating the substitute clock signal as the output clock signal based on the second input, until the reference clock input signal returns. When the reference clock input signal returns at step 532, method 500 may continue to step 534 to reset the loop filter bandwidth and phase margin and continue to step 512. If the reference clock input signal is still present, method 500 may continue to step 514 to generate the desired clock signal as the output clock signal based, at least in part, on the first input signal and the second input signal at step 514.

Figure 6:
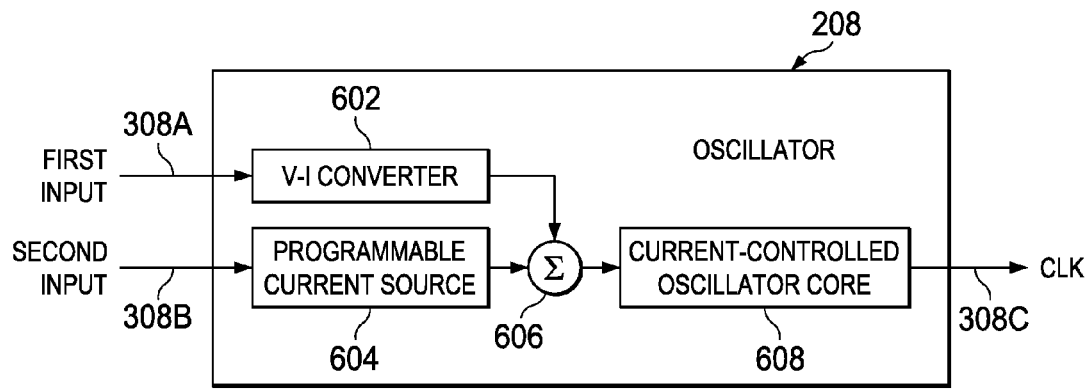
FIG. 6 is a block diagram of selected components of an oscillator with two inputs, in accordance with embodiments of the present disclosure.

The oscillator (e.g., oscillator 308 of FIG. 3), may generate the output clock signal based on the first input signal and the second input signal as described with reference to the method in accordance with the flow charts of FIG. 4 and FIG. 5. In one embodiment, the oscillator 308 may sum currents corresponding to the signals at the first input and the second input and provide the summed current to oscillator components. FIG. 6 is a block diagram illustrating an oscillator with two inputs according to one embodiment of the disclosure. Oscillator 308 may receive a first input through first input node 308A and a second input through second input node 308B. The first input may be provided to a voltage-to-current (V-I) converter 602 within the oscillator 308. The V-I converter 602 may generate a current proportional to the voltage of the input signal at input node 308A. The second input may be provided to a programmable current source 604. Programmable current source 604 may function as a simple, monotonic digital-to-analog converter (DAC). A range and resolution of the output frequency of oscillator 308 may be adjusted through design of programmable current source 604. Programmable current source 604 may include a plurality of current sources, in which each current source may be activated by a digital '1' or digital '0' in each bit of the digital signal received at input node 308B. For example, a digital signal of '1001' may turn on current sources of the plurality of current sources corresponding to bit 1 and bit 4. A current summer 606 may sum the current generated by V-I converter 602 and programmable/programmable current source 604. The summed current signal output by summer 606 may be provided to other circuitry 608 within the oscillator to generate the output clock signal CLK at a frequency specified by inputs to first input node 308A and second input node 308B.

Figure 7:
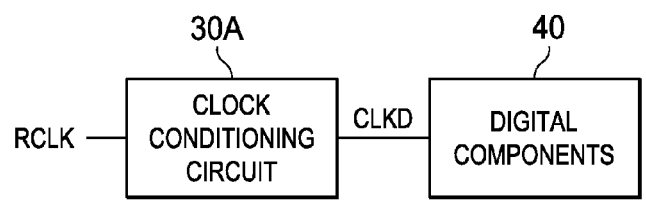
FIG. 7 is a block diagram of selected components of a digital circuit of a personal audio device, in accordance with embodiments of the present disclosure.

FIG. 7 is a block diagram of selected components of digital circuitry 6 of personal audio device 1, in accordance with embodiments of the present disclosure. Digital components 40 (e.g., processors, controllers, memories) of digital circuitry 6 and events occurring within digital circuitry 6 may be synchronized by a clock signal CLKD generated by a clock conditioning circuit 30A. Clock conditioning circuit 30 may receive reference clock input signal RCLK and generate a desired clock signal with the desired clock frequency as the clock signal CLKD based on reference clock input signal RCLK in the presence of reference clock input signal RCLK and generate a substitute clock signal as clock signal CLKD in the absence of reference clock input signal RCLK such that the clock signal CLKD is uninterrupted in the absence of reference clock input signal RCLK. Thus, in the embodiments represented by the figures herein, digital circuitry 6 of personal audio device 1 and the audio signal path of audio IC 9 may each have separate clock signals, wherein each clock signal CLK, CLKD is generated from a separate clock conditioning circuit 30, 30A. Clock conditioning circuits 30 and 30A may be similar in structure and/or function to each other, with differences in structure and/or function optimized for analog circuitry or digital circuitry, as appropriate. For example, any operational deficiencies caused by lack of a clock signal or variations of frequency of a clock signal to digital circuitry 6 for numerous clock cycles may not be perceptible to a user of personal audio device 1 while lack of a clock signal or variations of frequency of a clock signal to audio IC 9 may be perceptible to a user in the form of audio artifacts. Thus, parameters (e.g., frequency, duration of time since last clock transition) for determining the presence or absence of reference clock RCLK by clock conditioning circuit 30 may be different than similar parameters for determining the presence of absence of reference clock by clock conditioning circuit 30A.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An apparatus for providing an audio output signal to an audio transducer comprising:
   a signal path having an audio input for receiving an audio input signal, an audio output for providing the audio output signal, and a clock input for receiving a clock signal, wherein the signal path is configured to generate the audio output signal based on the input signal and in conformity with one or more parameters of the signal path; and
   a controller configured to:
       determine a presence or an absence of a reference clock input signal to a clock conditioning circuit for generating the clock signal, wherein the clock conditioning circuit generates a desired clock signal as the clock signal that is based on the reference clock input signal in the presence of the reference clock input signal and generates a substitute clock signal as the clock signal in the absence of the reference clock input signal such that the clock signal is uninterrupted in the absence of the reference clock input signal, and wherein the reference clock input signal is representative of a desired clock frequency for the clock signal;

measure an output frequency of the clock signal in the presence of the reference clock input signal;

implement a digital code generator for generating a digital code based on the output frequency; and responsive to determining the absence of the reference clock input signal:
  generate the substitute clock signal based on the digital code;
  cause the signal path to receive at the clock input the substitute clock signal in the absence of the reference clock input signal;
  modify the one or more parameters of the signal path in order to perform one or more of the following:
    reduce the presence of audio artifacts in the output signal caused by the absence of the reference clock input signal;
    power down at least one component of the signal path;
    continue to operate the signal path with the substitute clock signal; and
    transition the signal path to a mute condition or a zero volume condition; and implement a calibration circuit configured to, during a calibration of the clock conditioning circuit:
  cause the digital code generator to output a plurality of codes such that the clock conditioning circuit outputs a respective clock frequency responsive to each of the plurality of codes;
  measure the respective clock frequencies; and
  correlate each of the plurality codes to a certain frequency or frequency range based on the measuring.

2. The apparatus of claim 1, wherein the signal path comprises an analog signal portion having an analog input for receiving an analog input signal and further having the audio output, and configured to generate the output signal based on the analog input signal and in conformity with the one or more parameters.

3. The apparatus of claim 2, wherein the one or more parameters comprise an analog gain of the analog signal portion.

4. The apparatus of claim 3, wherein modifying the one or more parameters comprises ramping the analog gain to zero.

5. The apparatus of claim 2, wherein the audio input signal is a digital signal and the signal path further comprises a digital-to-analog conversion portion having a digital input for receiving a digital input signal and an analog output for providing an analog input signal, the digital-to-analog conversion portion configured to convert the digital input signal into the analog input signal in conformity with the one or more parameters.

6. The apparatus of claim 5, wherein the one or more parameters comprise a digital gain of the digital-to-analog conversion portion.

7. The apparatus of claim 6, wherein modifying the one or more parameters comprises ramping the digital gain to zero.

8. The apparatus of claim 1, wherein modifying the one or more parameters comprises modifying the audio input signal.

9. The apparatus of claim 8, wherein modifying the audio input signal comprises ramping the audio input signal to zero.

10. The apparatus of claim 8, wherein modifying the one or more parameters further comprises clamping the analog output to a predetermined direct current voltage.

11. The apparatus of claim 1, wherein modifying the one or more parameters causes the signal path to enter a mode wherein the signal path continues to operate uninterrupted with reduced audio performance of the audio output signal.

12. The apparatus of claim 1, wherein the controller is further configured to, responsive to determining the presence of the input reference signal following the absence of the input reference signal, reinstate the one or more parameters to their respective unmodified settings.

13. The apparatus of claim 1, wherein the clock conditioning circuit comprises a phase-locked loop.

14. The apparatus of claim 13, wherein the apparatus includes the clock conditioning circuit.

15. The apparatus of claim 14, wherein the phase-locked loop is, responsive to the absence of the reference clock input signal, configured to transition from a closed-loop mode to an open-loop mode such that an oscillator of the phase-locked loop for generating the clock signal continues to generate the clock signal without interruption.

16. The apparatus of claim 15, wherein the phase-locked loop is, responsive to determining the presence of the input reference signal following the absence of the input reference signal, configured to enter a closed-loop mode.

17. The apparatus of claim 1, further comprising:
  the clock conditioning circuit, wherein the clock conditioning circuit is configured to determine based on a first set of one or more parameters whether the reference clock input signal is present or absent; and
  a second clock conditioning circuit configured to generate a second desired clock signal as a second clock signal that is based on the reference clock input signal in the presence of the reference clock input signal and generate a second substitute clock signal as the second clock signal in the absence of the reference clock input signal such that the second clock signal is uninterrupted in the absence of the reference clock input signal, wherein the second clock conditioning circuit is configured to determine based on a second set of one or more parameters whether the reference clock input signal is present or absent; and
  further wherein the first set of one or more parameters and the second set of one or more parameters are different.

18. A method comprising:
  determining a presence or an absence of a reference clock input signal to a clock conditioning circuit for generating a clock signal, wherein the clock conditioning circuit generates a desired clock signal as the clock signal that is based on the reference clock input signal in the presence of the reference clock input signal and generates a substitute clock signal as the clock signal in the absence of the reference clock input signal such that the clock signal is uninterrupted in the absence of the reference clock input signal, and wherein the reference clock input signal is representative of a desired clock frequency for the clock signal;
  measuring an output frequency of the clock signal in the presence of the reference clock input signal;

generating a digital code based on the output frequency; and responsive to determining the absence of the reference clock input signal:

causing a signal path to receive at a clock input the substitute clock signal in the absence of the reference clock input signal, wherein the signal path comprises an audio input for receiving an audio input signal, an audio output for providing an audio output signal, and the clock input for receiving the clock signal;

generating the substitute clock signal based on the digital code;

modifying one or more parameters of the signal path in order to reduce the presence of audio artifacts in the output signal caused by the absence of the reference clock input signal, in order to perform one or more of the following:

reducing the presence of audio artifacts in the output signal caused by the absence of the reference clock input signal;

powering down at least one component of the signal path;

continuing to operate the signal path with the substitute clock signal; and transitioning the signal path to a mute condition or a zero volume condition; and during a calibration of the clock conditioning circuit:

causing the digital code generator to output a plurality of codes such that the clock conditioning circuit outputs a respective clock frequency responsive to each of the plurality of codes;

measuring the respective clock frequencies; and correlating each of the plurality codes to a certain frequency or frequency range based on the measuring;

wherein the signal path is configured to generate the audio output signal based on the input signal and in conformity with one or more parameters of the signal path.

19. The method of claim 18, wherein the signal path comprises an analog signal portion having an analog input for receiving an analog input signal and further having the audio output, and configured to generate the output signal based on the analog input signal and in conformity with the one or more parameters.

20. The method of claim 19, wherein the one or more parameters comprise an analog gain of the analog signal portion.

21. The method of claim 20, wherein modifying the one or more parameters comprises ramping the analog gain to zero.

22. The method of claim 19, wherein the audio input signal is a digital signal and the signal path further comprises a digital-to-analog conversion portion having a digital input for receiving a digital input signal and an analog output for providing an analog input signal, the digital-to-analog conversion portion configured to convert the digital input signal into the analog input signal in conformity with the one or more parameters.

23. The method of claim 22, wherein the one or more parameters comprise a digital gain of the digital-to-analog conversion portion.

24. The method of claim 23, wherein modifying the one or more parameters comprises ramping the digital gain to zero.

25. The method of claim 18, wherein modifying the one or more parameters comprises modifying the audio input signal.

26. The method of claim 25, wherein modifying the audio input signal comprises ramping the audio input signal to zero.

27. The method of claim 26, wherein modifying the one or more parameters further comprises clamping the analog output to a predetermined direct current voltage.

28. The method of claim 18, wherein modifying the one or more parameters causes the signal path to enter a mode wherein the signal path continues to operate uninterrupted with reduced audio performance of the audio output signal.

29. The method of claim 18, further comprising, responsive to determining the presence of the input reference signal following the absence of the input reference signal, reinstating the one or more parameters to their respective unmodified settings.

30. The method of claim 18, wherein the clock conditioning circuit comprises a phase-locked loop.

31. The method of claim 30, further comprising transitioning the phase-locked loop from a closed-loop mode to an open-loop mode responsive to the absence of the reference clock input signal, such that an oscillator of the phase-locked loop for generating the clock signal continues to generate the clock signal without interruption.

32. The method of claim 31, further comprising transitioning the phase-locked loop to the closed-loop mode responsive to determining the presence of the input reference signal following the absence of the input reference signal.

33. The method of claim 18, wherein determining the presence or the absence of the reference clock input signal to the clock conditioning circuit comprises determining based on a first set of one or more parameters whether the reference clock input signal is present or absent; and determining a presence or an absence of the reference clock input signal to a second clock conditioning circuit for generating a second clock signal, wherein the second clock conditioning circuit generates a second desired clock signal as the second clock signal that is based on the reference clock input signal in the presence of the reference clock input signal and generates a second substitute clock signal as the second clock signal in the absence of the reference clock input signal such that the second clock signal is uninterrupted in the absence of the reference clock input signal, and wherein the reference clock input signal is representative of a desired clock frequency for the second clock signal;

wherein the first set of one or more parameters and the second set of one or more parameters are different.

* * * * *